United States Patent [19]
Baker

[11] Patent Number: 5,953,276
[45] Date of Patent: Sep. 14, 1999

[54] FULLY-DIFFERENTIAL AMPLIFIER

[75] Inventor: R. Jacob Baker, Boise, Id.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

[21] Appl. No.: 08/993,837

[22] Filed: Dec. 18, 1997

[51] Int. Cl.$^6$ .................................................. G11C 7/00
[52] U.S. Cl. ............................ 365/208; 365/207; 327/52
[58] Field of Search ................................. 365/208, 207; 327/52, 53, 55

[56] References Cited

U.S. PATENT DOCUMENTS

| | | | |
|---|---|---|---|
| 4,459,660 | 7/1984 | Bellay et al. | 364/200 |
| 4,689,494 | 8/1987 | Chen et al. | 307/202.1 |
| 4,714,839 | 12/1987 | Chung | 307/441 |
| 4,720,817 | 1/1988 | Childers | 365/200 |
| 4,801,992 | 1/1989 | Golubic | 357/40 |
| 4,843,188 | 6/1989 | Patterson et al. | 174/52.4 |
| 4,958,088 | 9/1990 | Farah-Bakhsh et al. | 307/443 |
| 5,097,157 | 3/1992 | Jaffe et al. | 365/208 |
| 5,164,619 | 11/1992 | Luebs | 307/480 |
| 5,248,946 | 9/1993 | Murakami et al. | 365/208 |
| 5,278,460 | 1/1994 | Casper | 307/296.5 |
| 5,311,081 | 5/1994 | Donaldson et al. | 307/475 |
| 5,361,002 | 11/1994 | Casper | 327/530 |
| 5,412,593 | 5/1995 | Magel et al. | 365/96 |
| 5,422,529 | 6/1995 | Lee | 327/536 |
| 5,432,823 | 7/1995 | Gasbarro et al. | 375/356 |
| 5,442,589 | 8/1995 | Kowalski | 365/225.7 |
| 5,448,187 | 9/1995 | Kowalski | 326/81 |
| 5,451,898 | 9/1995 | Johnson | 327/563 |
| 5,465,060 | 11/1995 | Pelella | 327/51 |
| 5,488,321 | 1/1996 | Johnson | 327/66 |
| 5,495,436 | 2/1996 | Callahan | 365/96 |
| 5,526,312 | 6/1996 | Eltoukhy | 365/201 |
| 5,539,333 | 7/1996 | Cao et al. | 326/63 |
| 5,570,042 | 10/1996 | Ma | 326/63 |
| 5,572,458 | 11/1996 | Smith et al. | 365/96 |
| 5,572,476 | 11/1996 | Eltoukhy | 365/210 |
| 5,578,941 | 11/1996 | Sher et al. | 326/34 |
| 5,621,340 | 4/1997 | Lee et al. | 327/65 |
| 5,625,805 | 4/1997 | Fenwick et al. | 395/558 |
| 5,663,915 | 9/1997 | Mobley | 365/207 |
| 5,666,067 | 9/1997 | Sher et al. | 326/34 |
| 5,706,292 | 1/1998 | Merritt | 371/10.2 |
| 5,734,617 | 3/1998 | Zheng | 365/225.7 |
| 5,757,711 | 5/1998 | Nakaoka et al. | 365/207 |
| 5,781,486 | 7/1998 | Merritt | 365/201 |

FOREIGN PATENT DOCUMENTS

WO 95/22064  8/1995  WIPO.

OTHER PUBLICATIONS

Descriptive literature entitled, "400MHz SLDRAM, 4M × 16 SLDRAM Pipelined, Eight Bank, 2.5 V Operation," SLDRAM Consortium Advance Sheet, published throughout the United States, pp. 1–22.

"Draft Standard for a High–Speed Memory Interface (SyncLink)", Microprocessor and Microcomputer Standards Subcommittee of the IEEE Computer Society, Copyright 1996 by the Institute of Electrical and Electronics Engineers, Inc., New York, NY, pp. 1–56.

Chapman et al., "A Low–Cost High–Performance CMOS Timing Vernier for ATE", International Test Conference, Copyright 1995, Paper 21.2, pp. 459–468.

*Primary Examiner*—Tan T. Nguyen
*Attorney, Agent, or Firm*—Seed and Berry LLP

[57] ABSTRACT

A fully-differential high speed differential amplifier is formed by four pairs of complementary MOS transistors arranged as inverters connected between a current source node and a current sink node. Current is coupled to the current source node from a positive supply voltage by one or a pair of PMOS current source transistors, and current is coupled from the current sink node to a negative supply voltage by one or a pair of NMOS currents sink transistors. Two of the complementary pairs of transistors receive respective input signals and generate respective output signals. The remaining two complementary pairs of transistors also receive respective input signals, but they generate bias control signals that are applied to the current source and sink transistors. Where a pair of current source and sink transistors are used, each current source and sink transistor receives its control signal from a respective complementary pair of transistors. The differential amplifier is entirely symmetrical and therefore provides improved common mode signal rejection and true differential outputs while still being able to operate at a high-speed.

35 Claims, 4 Drawing Sheets

5,953,276

FULLY-DIFFERENTIAL AMPLIFIER

TECHNICAL FIELD

This invention relates to differential amplifiers, and more particularly to an inherently symmetrical, high-speed differential amplifier that may be used as a data buffer in memory devices such as dynamic random access memories ("DRAMs").

BACKGROUND OF THE INVENTION

Differential amplifiers are commonly used in the read data buffers or write data buffers of memory devices, such as dynamic random access memories ("DRAMs"). Write data buffers couple write data from one or more data terminals of the memory device to a memory array during a memory write operation. Read data buffers couple read data from the memory array to one or more data terminals of the memory device during a memory read operation. Typically, data are coupled to and from the memory array in complimentary form, and are coupled to and from the data terminals in single ended form. Thus, write and read data coupled between the data terminals and the memory array must be converted between single-ended and complimentary data formats.

The logic level corresponding to the single-ended data is generally determined by whether the voltage of the single-ended data signal is greater or less than respective high and low threshold voltages. The logic level corresponding to the complimentary data is generally determined by whether the voltage of the data signal is greater than or less than the voltage of the complimentary data signal. If the voltage of the data signal is greater than the voltage of the complimentary data signal, the data is considered to be a logic "1". If the voltage of the data signal is less than the voltage of the complimentary data signal, the data is considered to be a logic "0".

The respective voltages corresponding to the complimentary data coupled to and from the array often differ only slightly from each other. As a result, is can be difficult to determine whether the voltage of the data signal is greater than the voltage of the complimentary data signal (corresponding to logic "1") or the voltage of the data signal is less than the voltage of the complimentary data signal (corresponding to logic "0"). This problem is exacerbated in the presence of noise or other interference that may be coupled to the data and complimentary data lines.

In a differential amplifier, noise is usually impressed on both the data signal line and its complementary data signal line. Since the differential amplifier responds to differences in the voltage applied between its differential inputs, it does not significantly respond to noise signals applied to both inputs. Thus, a potential advantage of using a differential amplifier to amplify the complimentary data signals is that it will often be insensitive to noise. Thus, differential amplifiers display a high degree of immunity to common mode signals such as noise.

Ideally, differential amplifiers utilize symmetry to produce equal currents and voltages in identical portions of the differential amplifier circuitry. One conventional differential amplifier 10 is shown in FIG. 1. The amplifier 10 includes a pair of NMOS transistors 12, 14 having their sources coupled to each other and to a current sink 16. As is known in the art, the current sink 16 draws a predetermined constant current from the transistors 12, 14. The gates of the transistors 12, 14 receive respective differential input signals $+V_{IN}$ and $-V_{IN}$ at respective input terminals 20, 22. The drains of the transistors 12, 14 are coupled to a supply voltage $V_{CC}$ through respective load resistors 26, 28. An output voltage $V_O$ is developed between output terminals 30, 32 corresponding to the voltage difference between the input signals $+V_{IN}$ less $-V_{IN}$.

In operation, when the magnitude of $+V_{IN}$ increases and the magnitude of $-V_{IN}$ decreases, the percentage of the current I conducted by the transistor 12 increases and the percentage of the current I conducted by the transistor 14 decreases, although the sum of the current flowing through the two transistors 12, 14 remains essentially constant. As a result, the voltage drop across the resistor 26 increases and the voltage drop across the resistor 28 decreases. The increased voltage drop across the resistor 26 causes the voltage at the output terminal 30 to decrease while the decreased voltage drop across the resistor 28 causes the voltage at the output terminal 32 to increase. Typically, the change in voltage of the output voltage $V_O$ between the terminals is significantly greater than the change in voltage of $+V_{IN}$ less $-V_{IN}$. The amplifier 10 responds in the opposite manner to a decrease in the magnitude of $+V_{IN}$ and an increase in the magnitude of $-V_{IN}$.

While the differential amplifier 10 does perform adequately in many applications, it has a variety of shortcomings when used in more demanding applications. For this reason, an improved differential amplifier 40 shown in FIG. 2 was developed. The differential amplifier 40 is the result of adding to the differential amplifier 10 of FIG. 1 PMOS transistors 46, 48 used as load impedances, a PMOS transistor 50 used as a current source, and an NMOS transistor 52 used as a current sink.

In operation, an increase in the input voltage $+V_{IN}$ increases the channel resistance of the PMOS transistor 46 and decreases the channel resistance of the NMOS transistor 12. As a result, the voltage on the output terminal 30 decreases. At the same time, the corresponding increase in the input voltage $-V_{IN}$ decreases the channel resistance of the PMOS transistor 48 and increases the channel resistance of the NMOS transistor 14. As a result, the voltage on the output terminal 32 increases.

When transistors 50, 52 are used to control the sum of the current through the transistors 12, 14, it can be difficult to bias the transistors 50, 52 in a stable manner. As a result, internal bias is often used. The internal bias of the differential amplifier 40 of FIG. 2 results from the connection of the output terminal 30 to the gates of the current source and sink transistors 50, 52, respectively. As the voltage on the output terminal 30 increases, the channel resistance of the NMOS current sink transistor 52 decreases, but the channel resistance of the PMOS current source transistor 50 increases. Conversely, as the voltage on the output terminal 30 decreases, the channel resistance of the NMOS current sink transistor 52 increases and the channel resistance of the PMOS current source transistor 50 decreases. As a result, the sum of the current through the transistors 12, 14 remains essentially constant.

Although the differential amplifier 40 shown in FIG. 2 is biased in a stable manner, the manner in which the biasing circuitry is connected can cause other problems. These problems result from the fact that the differential amplifier 40 is not entirely symmetrical because the bias circuit is connected to only one output terminal, namely the output terminal 30. There is no corresponding connection of a bias circuit to the output terminal 32. As a result, the bias circuit loads the PMOS transistor 46 and the NMOS transistor 12 generating the output voltage on the output terminal 30, but there is no corresponding load on the PMOS transistor 48 and the NMOS transistor 14 generating the output voltage on the output terminal 32. This lack of symmetry can result in offset voltages at the differential output terminals 30, 32 as well as a reduced ability to reject common mode voltages, such as noise.

As mentioned above, differential amplifiers are commonly used in memory devices to couple data signals between a memory array and data terminals of the memory device. For such applications, it is important that the differential amplifier be able to operate at a high speed since the demand for higher performance in computers and computing circuitry requires memories that will transfer data at a faster rate. It is therefore important that any solution to the above described problem does not limit the operating speed of differential amplifiers. For example, noise in differential amplifiers could be reduced by low-pass filtering to limit the bandwidth of differential amplifiers, but doing so would limit the speed at which differential amplifiers could transfer data.

There is therefore a need for a high speed, inherently symmetrical differential amplifier that can be biased in a stable manner.

SUMMARY OF THE INVENTION

A differential amplifier includes first and second amplifying circuits and an internal bias circuit. The first and second amplifying circuits generate respective first and second differential output signals from respective first and second differential input signal. The internal bias circuit is structured to internally bias the first and second amplifying circuits. Significantly, the first amplifying circuit, the second amplifying circuit, and the internal bias circuit are entirely symmetrical thereby ensuring true differential performance. The first and second amplifying circuits preferably include respective pairs of PMOS and NMOS transistors coupled between a current source node and a current sink node. The source of the PMOS transistor in each pair is coupled to the current source node, and the source of the NMOS transistor in each pair is coupled to the current sink node. The drains of the PMOS and NMOS transistors in each pair are coupled to each other to generate a respective one of the differential output signals. The gates of the PMOS and NMOS transistors in each pair are coupled to each other and coupled to receive a respective one of the differential input signals. The internal bias circuit preferably includes first and second electronically controlled current devices coupled between respective positive and negative supply voltages and the current source and current sink nodes, respectively. The electronically controlled current devices each have a control terminal adapted to receive a voltage to control the current flowing through the current device. The internal bias also preferably includes respective pairs of PMOS and NMOS transistors coupled between the current source node and the current sink node. The source of the PMOS transistor in each pair is coupled to the current source node, and the source of the NMOS transistor in each pair is coupled to the current sink node. The drains of the PMOS and NMOS transistors in each pair are coupled to the control terminals of the first and second electronically controlled current devices, and the gates of the PMOS and NMOS transistors in each pair are coupled to each other and coupled to receive a respective one of the differential input signals.

The first electronically controlled current device includes one PMOS transistor or a pair of PMOS transistors coupled source to the positive supply voltage, and drain to the current source node. Where a single PMOS transistor is used, its gate coupled to the drains of the transistors in the pairs of transistors of the internal bias circuit. Where a pair of PMOS transistors are used, their gates are coupled to the drains of the transistors in respective pairs of transistors of the internal bias circuit. Similarly, the second electronically controlled current device includes one NMOS transistor or a pair of NMOS transistors coupled source to the negative supply voltage, and drain to the current sink node. Where a single NMOS transistor is used, its gate coupled to the drains of the transistors in the pairs of transistors of the internal bias circuit. Where a pair of NMOS transistors are used, their gates are coupled to the drains of the transistors in respective pairs of transistors of the internal bias circuit The inventive differential amplifier is ideally used in the read buffer or the write buffer of a memory device to couple signals between an externally accessible data terminal and one or more memory arrays of the memory device. The resulting memory device may be used in a variety of electronic systems, including computer systems.

DETAILED DESCRIPTION OF THE INVENTION

Figure 3:
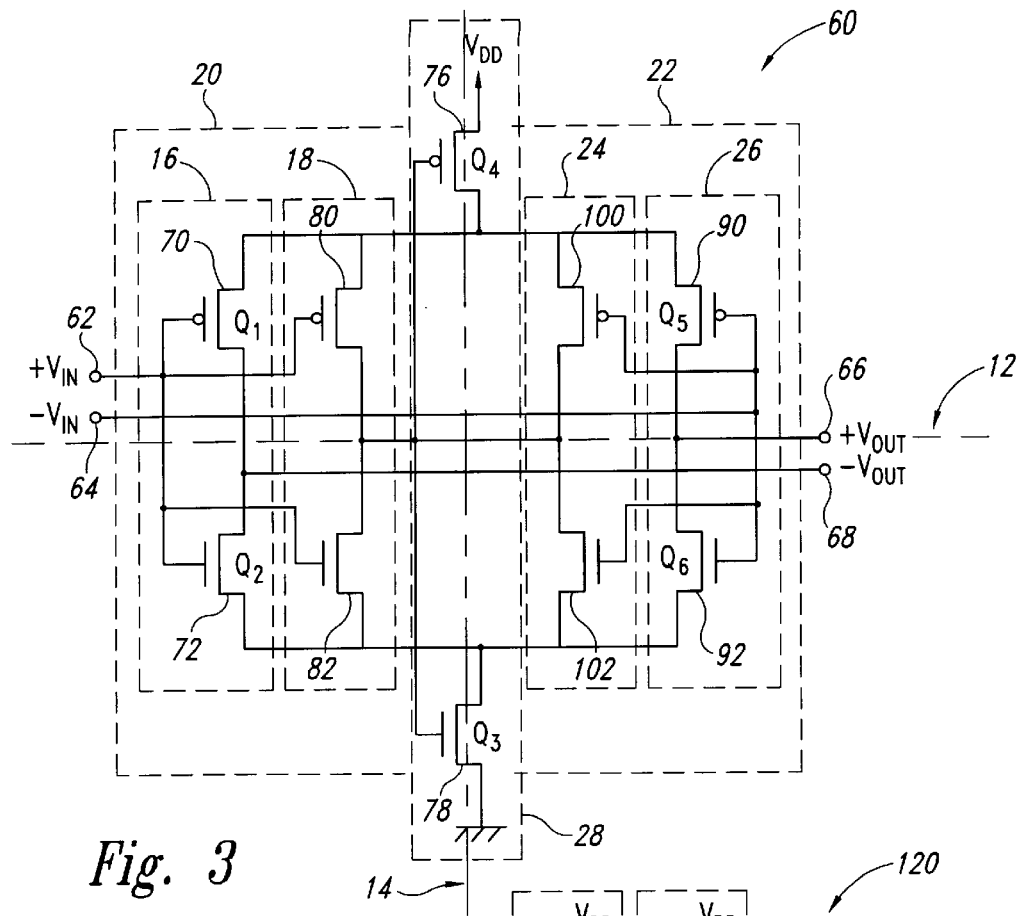
FIG. 3 is a schematic diagram of one embodiment of a differential amplifier according to the present invention.

One embodiment of a differential amplifier in accordance with the invention is shown in FIG. 3. As explained below, the differential amplifier 60 is fully symmetrical, i.e., the circuitry coupled to one input terminal is the same as the circuitry coupled to the other input terminal, and the circuitry coupled to one output terminal is the same as the circuitry coupled to the other output terminal. A result of the symmetry in the topology of the differential amplifier 60, the operation of the amplifier 60 is fully differential. The differential amplifer 60 is thus immune to common mode signals, such as noise, as well as power supply variations.

With reference to FIG. 3, the differential amplifier 60 receives complimentary input signals +Vin and −Vin on respective complimentary input terminals 62, 64, and it generates complimentary output signals +Vout and −Vout on respective complimentary output terminals 66, 68.

Figure 1:
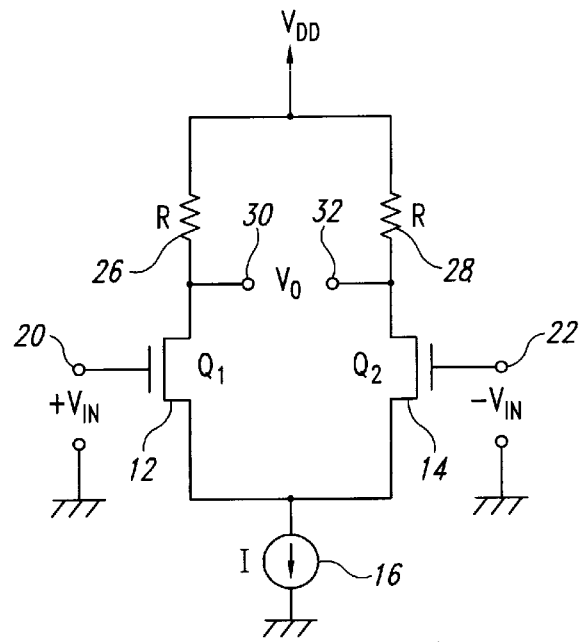
FIG. 1 is a schematic diagram of a conventional differential amplifier circuit.
Figure 2:
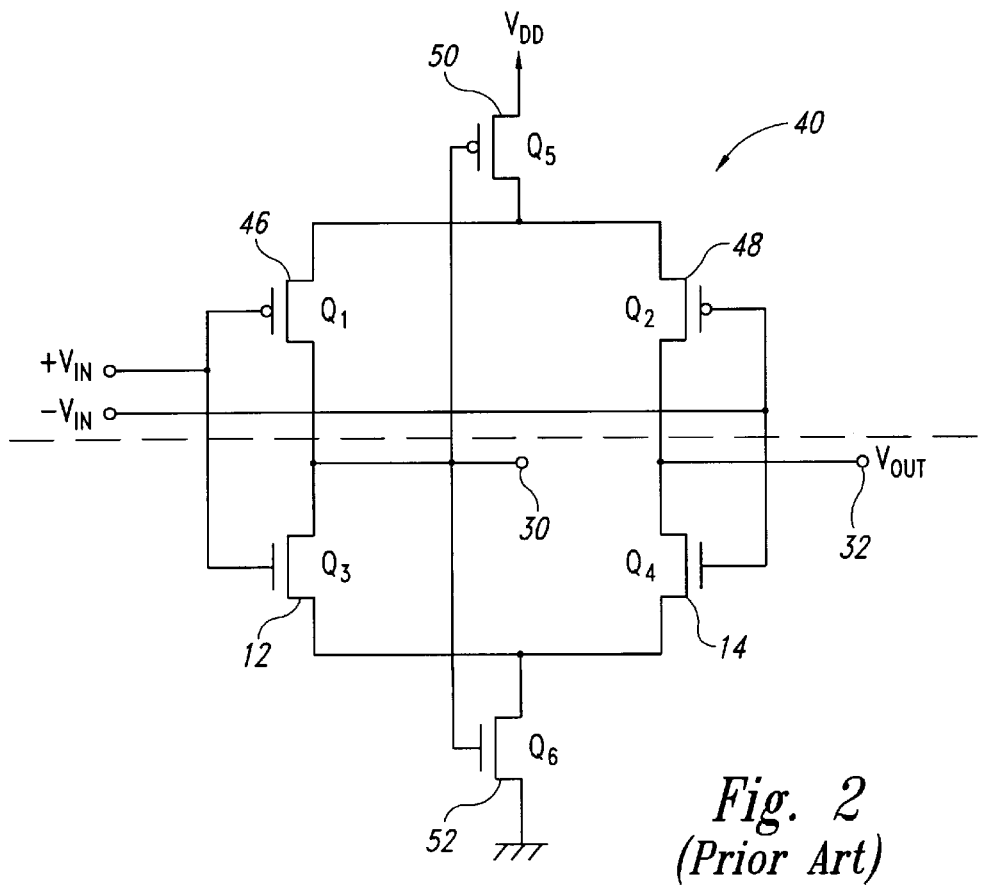
FIG. 2 is a schematic diagram of a conventional, internally biased differential amplifier.

The input signal +Vin is coupled from the input terminal 62 to the gate of a PMOS transistor 70 and the gate of a NMOS transistor 72. The drains of the two transistors 70, 72 are coupled to each other and to the output terminal 68 on which the output signal −Vout is generated. The transistors 70, 72 thus correspond essentially to the transistors 48, 14, respectively, in the differential amplifier 40 of FIG. 2. The source of the PMOS transistor 70 is coupled to the drain of a current source PMOS transistor 76 while the drain of the NMOS transistor 72 is coupled to the drain of a current sink NMOS transistor 78.

The input terminal 62 receiving the input signal +Vin is also coupled to the gate of a PMOS transistor 80 and the gate of an NMOS transistor 82. The drains of the two transistors 80, 82 are coupled to the gates of the current source and sink transistors 76, 78, respectively. The transistors 80, 82 thus correspond essentially to the transistors 46, 12, respectively, in the differential amplifier 40 to FIG. 2.

The above-described circuitry that includes the transistors 70, 72 and 80, 82 is mirrored by the circuitry on the right hand side of FIG. 3. Thus, the input terminal 64 that receives the input signal −Vin is coupled to the gate of a PMOS transistor 90 and to the gate of an NMOS transistor 92. The drains of the transistors 90, 92 are coupled to each other and to the output terminal 66 on which the output signal +Vout is generated. The transistors 90, 92 thus correspond essentially to the transistors 70, 72 and 48, 14 in the differential amplifier 40 of FIG. 2. The input terminal 64 is also coupled to the gate of an NMOS transistor 100 and to the gate of a PMOS transistor 102. The drains of the two transistors 100, 102 are coupled to each other and to the gates of the current source and sink transistors 76, 78, respectively. The transistors 100, 102 thus correspond essentially to the transistors 80, 82 and 46, 12 in the differential amplifier 40 of FIG. 2.

It is important to note that the circuitry used in the differential amplifiers 60 is entirely symmetrical. Each input terminal 62, 64 is coupled to a pair of transistors 70, 72 and 90, 92, respectively, on which an output signal is generated. Each input terminal 62, 64 is also coupled to a pair transistors 80, 82 and 100, 102 that control the current source and sink transistors 76, 78, respectively. In particular, none of the transistors 80, 82 and 100, 102 that control the current source and sink transistors 76, 78 load the transistors 70, 72 and 90, 92, respectively, on which the output signal is generated. The complete symmetry of the differential amplifier 60 thus allows it to have good common mode rejection while still being able to operate at high speeds.

In operation, an increase in the voltage +Vin will increase the channel resistance of the PMOS transistor 70 and decrease the channel resistance of the NMOS transistor 72. As a result, the voltage −Vout will decrease. At the same time, the corresponding decrease in the voltage −Vin will decrease the channel resistance of the PMOS transistor 90 and increase the channel resistance of the NMOS transistor 92. As a result, the voltage +Vout will increase. The circuit responds in the opposite manner to a decrease in the voltage +Vin and corresponding increase in the voltage −Vin. Thus, noise and spurious signals present on each input are amplified identically providing no difference in voltage at the output terminals 66, 68.

The signals developed between the transistors 80, 82 and between the transistors 100, 102 internally bias the current source and sink transistors 76, 78, as also explained above except that the voltage applied to the gates of the transistors 76, 78 tends to remain more constant. The voltage applied to the gates of the transistors 76, 78 remains relatively constant because changes in the channel resistance of the PMOS transistor 80 are counteracted by an opposite change in the channel resistance of the PMOS transistor 100, and any change in the channel resistance of the NMOS transistor 82 is counteracted by an opposite change in the channel assistance of the NMOS transistor 102.

Figure 4:
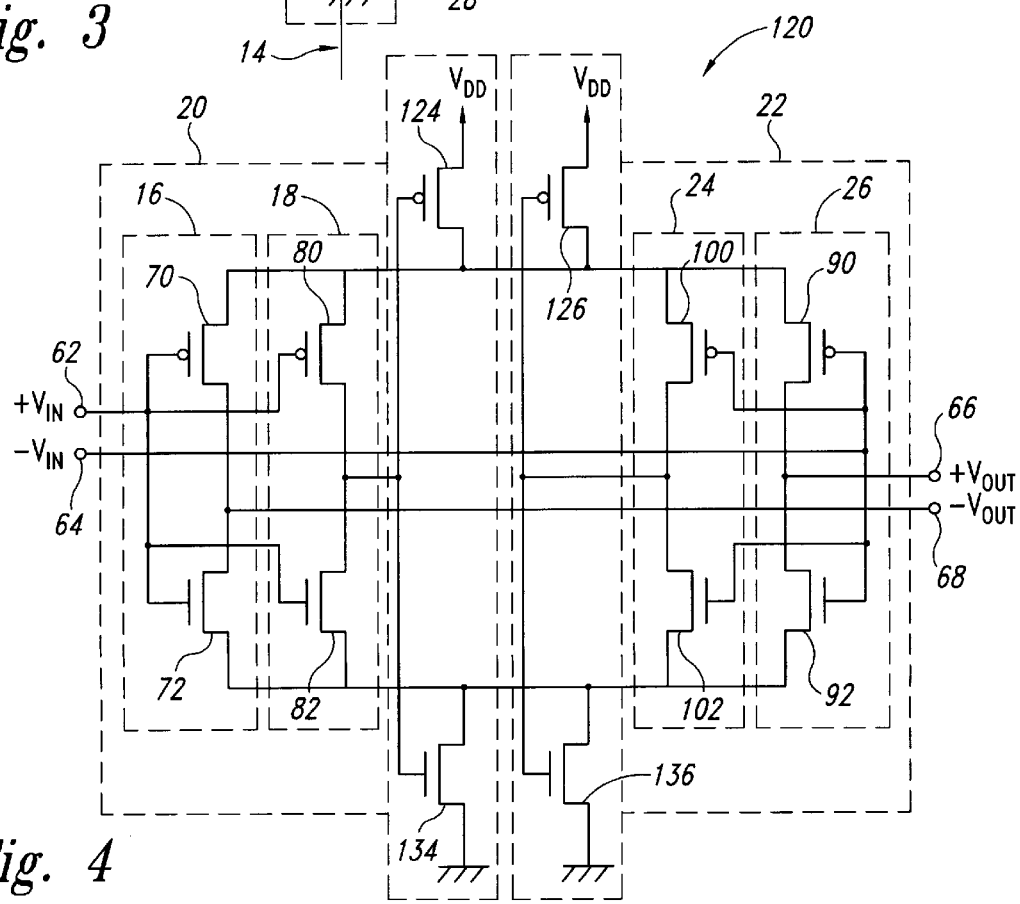
FIG. 4 is a schematic diagram of another embodiment of a differential amplifier according to the present invention.

An alternative embodiment of a differential amplifier 120 in accordance with the invention is illustrated in FIG. 4. The differential amplifier 120 shown in FIG. 4 uses most of the same components connected in the same manner as the differential amplifier 60 of FIG. 3. Therefore, in the interest of brevity, corresponding components in FIG. 4 will be provided with the same reference numerals, and an explanation of their operation will not be repeated.

The differential amplifier 120 differs from the differential amplifier 60 by using a pair of PMOS current source transistors 124, 126 instead of the single PMOS current source transistors 76 used in the differential amplifier 60. Similarly, the differential amplifier 120 uses a pair of NMOS current sink transistors 134, 136 instead of the single current sink NMOS transistor 78 used in the differential amplifier 60.

The gates of the current source transistor 124 and the current sink transistor 134 are coupled to the drains of the transistors 80, 82, while the gates of the current source transistor 126 and current sink transistor 136 are coupled to the drains of the transistors 100, 102. In operation, an increase in the voltage on the drains of the transistors 80, 82 increases the channel resistance of the PMOS transistor 124 and decreases the channel resistance of the NMOS transistor 134. However, those changes are counteracted by a decrease in the voltage on the drains of the transistors 90, 92 which decreases the channel resistance of the PMOS transistor 126 and increases the channel resistance of the NMOS transistor 136. Thus, the resistance of the parallel combination of the PMOS transistors 124, 126 and the resistance of the parallel combination of the NMOS transistors 134, 136 remain essentially constant.

Figure 5:
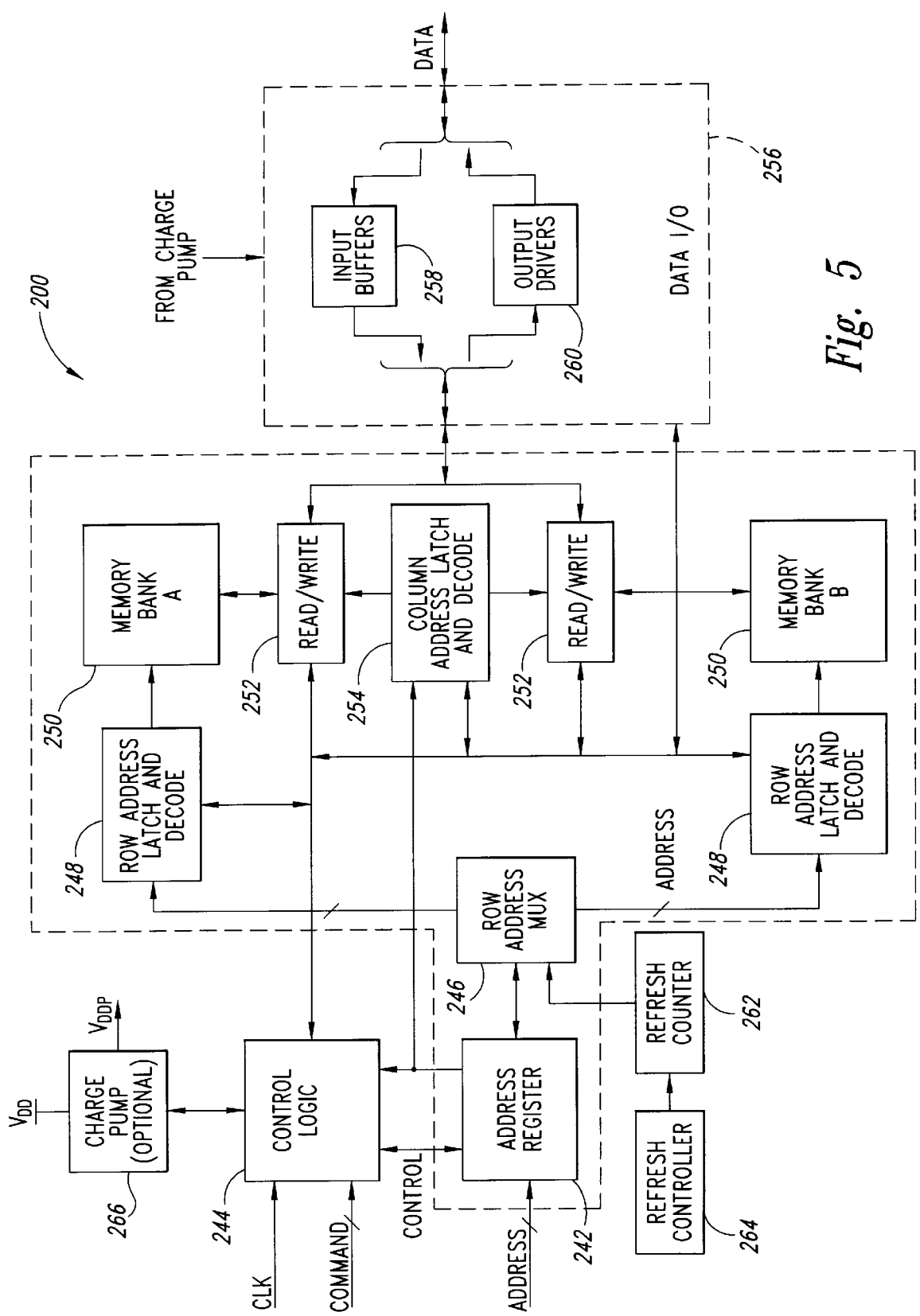
FIG. 5 is a block diagram of a memory device that uses the differential amplifier of FIG. 3 or FIG. 4 to couple data signals between the array of the memory device and externally accessible data terminals.

FIG. 5 is a block diagram of one embodiment of a memory device 200 that can advantageously use the differential amplifiers 60, 120 of FIGS. 3 or 4, respectively, to achieve superior performance. The memory circuit 200 includes memory banks 250a and 250b each of which includes one or more memory arrays. In one embodiment, the memory device 200 is a synchronous DRAM (SDRAM), although it may be another type of memory in other embodiments.

The memory device 200 includes an address register 242, which receives an address from an ADDRESS bus. A control logic circuit 244 receives a clock (CLK) signal, receives clock enable (CKE), chip select ($\overline{CS}$), row address strobe ($\overline{RAS}$), column address strobe ($\overline{CAS}$), and write enable ($\overline{WE}$) signals from the COMMAND bus, and communicates with the other circuits of the memory device 200. A row-address multiplexer 246 receives the address signal from the address register 242 and provides the row address to the row-address latch-and-decode circuits 248a and 248b for the memory bank 250a or the memory bank 250b, respectively. During read and write cycles, the row-address latch-and-decode circuits 248a and 248b activate the word lines of the addressed rows of memory cells in the memory banks 250a and 250b, respectively. Read/write circuits 252a and 252b read data from the addressed memory cells in the memory banks 250a and 250b, respectively, during a read cycle, and write data to the addressed memory cells during a write cycle. A column-address latch-and-decode circuit 254 receives the address from the address register 242 and provides the column address of the selected memory cells to the read/write circuits 252a and 252b. For clarity, the address register 242, the row-address multiplexer 246, the row-address latch-and-decode circuits 248a and 248b, and the column-address latch-and-decode circuit 254 can be collectively referred to as an address decoder.

A data input/output (I/O) circuit 256 includes a plurality of write buffers 258. During a write cycle, the buffers 258 receive and store write data from the DATA bus, and the read/write circuits 252a and 252b provide the stored data to the memory banks 250a and 250b, respectively. The data I/O circuit 256 also includes a plurality of read buffers 260. During a read cycle, the read/write circuits 252a and 252b provide data from the memory banks 250a and 250b, respectively, to the buffers 260, which in turn provide this data to the DATA bus. The write buffers 258 may use a differential amplifier 60, 120 in accordance with the invention to couple write data from the DATA bus to the memory banks 250a and 250b via the read/write circuits 252a and 252b, respectively. Similarly, the read buffers 260 may use a differential amplifier 60, 120 in accordance with the invention to couple read data from the memory banks 250a and 250b to the DATA bus via the read/write circuits 252a and 252b, respectively.

A refresh counter 262 stores the address of the row of memory cells to be refreshed either during a conventional auto-refresh mode or self-refresh mode. After the row is refreshed, a refresh controller 264 updates the address in the refresh counter 262, typically by either incrementing or decrementing the contents of the refresh counter 262 by one. Although shown separately, the refresh controller 264 may be part of the control logic 244 in other embodiments of the memory device 200.

The memory device 200 may also include an optional charge pump 266, which steps up the power-supply voltage $V_{DD}$ to a voltage $V_{DDP}$. In one embodiment, the pump 266 generates $V_{DDP}$ approximately 1–1.5 V higher than $V_{DD}$. The memory device 200 may also use $V_{DDP}$ to conventionally overdrive selected internal transistors.

Figure 6:
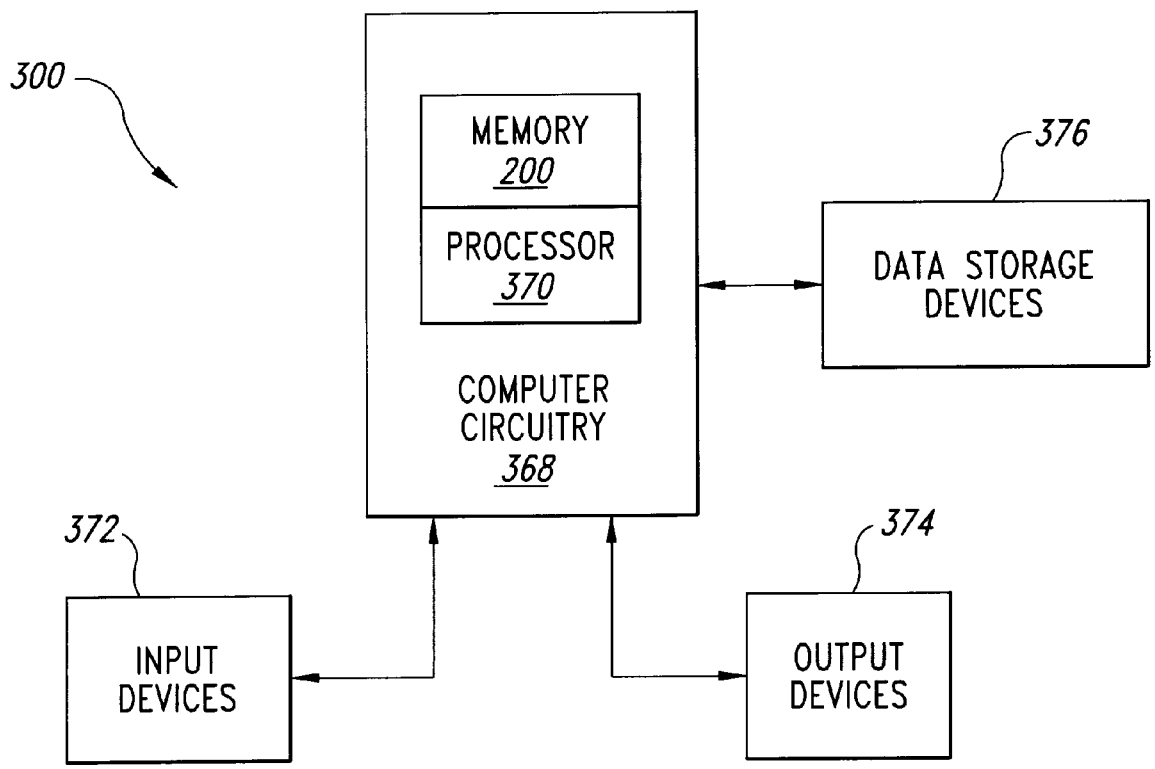
FIG. 6 is a block diagram of a computer system using the memory device of FIG. 5.

FIG. 6 is a block diagram of a computer system 300 that incorporates the memory device 200 of FIG. 5. The computer system 300 also includes computer circuitry 368 for performing computer functions, such as executing software to perform desired calculations and tasks. The circuitry 368 typically includes a processor 370, which is coupled to the memory device 200. One or more input devices 372, such as a keyboard or a mouse, are coupled to the computer circuitry 368 and allow an operator (not shown) to manually input data thereto. One or more output devices 374 are coupled to the computer circuitry 368 to provide to the operator data generated by the computer circuitry 368. Examples of such output devices 374 include a printer and a video display unit. One or more data-storage devices 376 are coupled to the computer circuitry 368 to store data on or retrieve data from external storage media (not shown). Examples of the storage devices 376 and the corresponding storage media include drives that accept hard and floppy disks, tape cassettes, and compact disk read-only memories (CD-ROMs). Typically, the computer circuitry 368 includes address data and command buses and a clock line that are respectively coupled to the ADDRESS, DATA, and COMMAND buses, and the CLK line of the memory device 200.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A differential amplifier, comprising:
   a first pair of PMOS and NMOS transistors coupled between a current source node and a current sink node, in which the source of the PMOS transistor is coupled to the current source node, the source of the NMOS transistor is coupled to the current sink node, the drains of the PMOS and NMOS transistors are coupled to each other and to a first output terminal, and the gates of the PMOS and NMOS transistors are coupled to each other and to a first input terminal;
   a second pair of PMOS and NMOS transistors coupled between the current source node and the current sink node, in which the source of the PMOS transistor is coupled to the current source node, the source of the NMOS transistor is coupled to the current sink node, the drains of the PMOS and NMOS transistors are coupled to each other, and the gates of the PMOS and NMOS transistors are coupled to each other and to a second input terminal;
   an electronically controlled current source device coupled between a positive supply voltage and the current source node, the electronically controlled current source device having a control terminal adapted to receive a voltage to control the current flowing through the current source device;
   an electronically controlled current sink device coupled between a negative supply voltage and the current sink node, the electronically controlled current sink device having a control terminal adapted to receive a voltage to control the current flowing through the current sink device;
   a third pair of PMOS and NMOS transistors coupled between the current source node and the current sink node, in which the source of the PMOS transistor is coupled to the current source node, the source of the NMOS transistor is coupled to the current sink node, the drains of the PMOS and NMOS transistors are coupled to each other and to the control terminal of the current source device and the control terminal of the current sink device, and the gates of the PMOS and NMOS transistors are coupled to each other and to the first input terminal; and
   a fourth pair of PMOS and NMOS transistors coupled between the current source node and a current sink node, in which the source of the PMOS transistor is coupled to the current source node, the source of the NMOS transistor is coupled to the current sink node, the drains of the PMOS and NMOS transistors are coupled to each other and to the control terminal of the current source device and the control terminal of the current sink device, and the gates of the PMOS and NMOS transistors are coupled to each other and to the second input terminal.

2. The differential amplifier of claim 1 wherein the current source device comprises a PMOS transistor having its source coupled to the positive supply voltage, its drain coupled to the current source node, and its gate coupled to the drains of the transistors in the third and fourth pairs, and the current sink device comprises an NMOS transistor having its source coupled to the negative supply voltage, its drain coupled to the current sink node, and its gate coupled to the drains of the transistors in the third and fourth pairs.

3. The differential amplifier of claim 1 wherein the current sink device comprises:
   a first NMOS transistor having its source coupled to the negative supply voltage, its drain coupled to the current sink node, and its gate coupled to the drains of the transistors in the third pair of transistors; and
   a second NMOS transistor having its source coupled to the negative supply voltage, its drain coupled to the current sink node, and its gate coupled to the drains of the transistors in the fourth pair of transistors.

4. The differential amplifier of claim 1 wherein the current source device comprises:

a first PMOS transistor having its source coupled to the positive supply voltage, its drain coupled to the current source node, and its gate coupled to the drains of the transistors in the third pair of transistors; and a second PMOS transistor having its source coupled to the positive supply voltage, its drain coupled to the current source node, and its gate coupled to the drains of the transistors in the fourth pair of transistors.

5. The differential amplifier of claim 4 wherein the current sink device comprises:

a first NMOS transistor having its source coupled to the negative supply voltage, its drain coupled to the current sink node, and its gate coupled to the drains of the transistors in the third pair of transistors; and a second NMOS transistor having its source coupled to the negative supply voltage, its drain coupled to the current sink node, and its gate coupled to the drains of the transistors in the fourth pair of transistors.

6. The differential amplifier of claim 1 wherein the negative supply voltage comprises ground potential.

7. The differential amplifier of claim 1 wherein drains of the PMOS and NMOS transistors in the second pair are coupled to a second output terminal so that the first and second output terminals are differential output terminals.

8. A differential amplifier, comprising:

a first amplifying circuit generating a first differential output signal from a first differential input signal;

a second amplifying circuit generating a second differential output signal from a second differential input signal; and an internal bias circuit structured to internally bias the first and second amplifying circuits, the first amplifying circuit, the second amplifying circuit, and the internal bias circuit being entirely symmetrical at all circuit nodes.

9. The differential amplifier of claim 8 wherein:

the first and second amplifying circuits comprise respective pairs of PMOS and NMOS transistors coupled between a current source node and a current sink node, in which the source of the PMOS transistor in each pair is coupled to the current source node, the source of the NMOS transistor in each pair is coupled to the current sink node, the drains of the PMOS and NMOS transistors in each pair are coupled to each other to generate a respective one of the differential output signals, and the gates of the PMOS and NMOS transistors in each pair are coupled to each other and coupled to receive a respective one of the differential input signals; and wherein the internal bias circuit comprises:

first and second electronically controlled current devices coupled between respective positive and negative supply voltages and the current source and current sink nodes, respectively, the electronically controlled current devices each having a control terminal adapted to receive a voltage to control the current flowing through the current device; and respective pairs of PMOS and NMOS transistors coupled between the current source node and the current sink node, in which the source of the PMOS transistor in each pair is coupled to the current source node, the source of the NMOS transistor in each pair is coupled to the current sink node, the drains of the PMOS and NMOS transistors in each pair are coupled to the control terminals of the first and second electronically controlled current devices, and the gates of the PMOS and NMOS transistors in each pair are coupled to each other and coupled to receive a respective one of the differential input signals.

10. The differential amplifier of claim 9 wherein the first electronically controlled current device comprises a PMOS transistor having its source coupled to the positive supply voltage, its drain coupled to the current source node, and its gate coupled to the drains of the transistors in the pairs of transistors of the internal bias circuit, and wherein the second electronically controlled current device comprises an NMOS transistor having its source coupled to the negative supply voltage, its drain coupled to the current sink node, and its gate coupled to the drains of the transistors in the pairs of transistors of the internal bias circuit.

11. The differential amplifier of claim 9 wherein the second electronically controlled current device comprises first and second NMOS transistors each having its source coupled to the negative supply voltage, its drain coupled to the current sink node, and its gate coupled to the drains of the transistors in a respective pair of the transistors of the internal bias circuit.

12. The differential amplifier of claim 9 wherein the first electronically controlled current device comprises first and second PMOS transistor each having its source coupled to the positive supply voltage, its drain coupled to the current source node, and its gate coupled to the drains of the transistors in a respective pair of the transistors of the internal bias circuit.

13. The differential amplifier of claim 9 wherein:

the first electronically controlled current device comprises first and second PMOS transistor each having its source coupled to the positive supply voltage, its drain coupled to the current source node, and its gate coupled to the drains of the transistors in a respective pair of the transistors of the internal bias circuit; and the second electronically controlled current device comprises first and second NMOS transistors each having its source coupled to the negative supply voltage, its drain coupled to the current sink node, and its gate coupled to the drains of the transistors in a respective pair of the transistors of the internal bias circuit.

14. The differential amplifier of claim 9 wherein the negative supply voltage comprises ground potential.

15. A memory device, comprising:

at least one array of memory cells adapted to store data at a location determined by a row address and a column address;

a row address circuit adapted to receive and decode the row address, and select a row of memory cells corresponding to the row address;

a column address circuit adapted to receive or apply data to one of the memory cells in the selected row corresponding to the column address;

a control circuit adapted to receive a command from an external source and generate control signals responsive thereto to cause write data to be stored in and read data to be output from the memory cells of the at least one array;

a read data path having a read register adapted to couple read data from the memory array to an externally accessible data terminal;

a write data path having a write register adapted to couple write data from the externally accessible data terminal to the memory array; and a differential amplifier included in the register of at least one of the data paths to couple data signals between the externally accessible data terminal to the memory array, the differential amplifier comprising:

a first pair of PMOS and NMOS transistors coupled between a current source node and a current sink node, in which the source of the PMOS transistor is coupled to the current source node, the source of the NMOS transistor is coupled to the current sink node, the drains of the PMOS and NMOS transistors are coupled to each other and to a first output terminal, and the gates of the PMOS and NMOS transistors are coupled to each other and to a first input terminal;

a second pair of PMOS and NMOS transistors coupled between the current source node and the current sink node, in which the source of the PMOS transistor is coupled to the current source node, the source of the NMOS transistor is coupled to the current sink node, the drains of the PMOS and NMOS transistors are coupled to each other, and the gates of the PMOS and NMOS transistors are coupled to each other and to a second input terminal;

an electronically controlled current source device coupled between a positive supply voltage and the current source node, the electronically controlled current source device having a control terminal adapted to receive a voltage to control the current flowing through the current source device;

an electronically controlled current sink device coupled between a negative supply voltage and the current sink node, the electronically controlled current sink device having a control terminal adapted to receive a voltage to control the current flowing through the current sink device;

a third pair of PMOS and NMOS transistors coupled between the current source node and the current sink node, in which the source of the PMOS transistor is coupled to the current source node, the source of the NMOS transistor is coupled to the current sink node, the drains of the PMOS and NMOS transistors are coupled to each other and to the control terminal of the current source device and the control terminal of the current sink device, and the gates of the PMOS and NMOS transistors are coupled to each other and to the first input terminal; and a fourth pair of PMOS and NMOS transistors coupled between the current source node and a current sink node, in which the source of the PMOS transistor is coupled to the current source node, the source of the NMOS transistor is coupled to the current sink node, the drains of the PMOS and NMOS transistors are coupled to each other and to the control terminal of the current source device and the control terminal of the current sink device, and the gates of the PMOS and NMOS transistors are coupled to each other and to the second input terminal.

16. The memory device of claim 15 wherein the current source device comprises a PMOS transistor having its source coupled to the positive supply voltage, its drain coupled to the current source node, and its gate coupled to the drains of the transistors in the third and fourth pairs, and the current sink device comprises an NMOS transistor having its source coupled to the negative supply voltage, its drain coupled to the current sink node, and its gate coupled to the drains of the transistors in the third and fourth pairs.

17. The memory device of claim 15 wherein the current sink device comprises:

a first NMOS transistor having its source coupled to the negative supply voltage, its drain coupled to the current sink node, and its gate coupled to the drains of the transistors in the third pair of transistors; and a second NMOS transistor having its source coupled to the negative supply voltage, its drain coupled to the current sink node, and its gate coupled to the drains of the transistors in the fourth pair of transistors.

18. The memory device of claim 15 wherein the current source device comprises:

a first PMOS transistor having its source coupled to the positive supply voltage, its drain coupled to the current source node, and its gate coupled to the drains of the transistors in the third pair of transistors; and a second PMOS transistor having its source coupled to the positive supply voltage, its drain coupled to the current source node, and its gate coupled to the drains of the transistors in the fourth pair of transistors.

19. The memory device of claim 18 wherein the current sink device comprises:

a first NMOS transistor having its source coupled to the negative supply voltage, its drain coupled to the current sink node, and its gate coupled to the drains of the transistors in the third pair of transistors; and a second NMOS transistor having its source coupled to the negative supply voltage, its drain coupled to the current sink node, and its gate coupled to the drains of the transistors in the fourth pair of transistors.

20. The memory device of claim 15 wherein the negative supply voltage comprises ground potential.

21. The memory device of claim 15 wherein drains of the PMOS and NMOS transistors in the second pair are coupled to a second output terminal so that the first and second output terminals are differential output terminals.

22. A memory device, comprising:

at least one array of memory cells adapted to store data at a location determined by a row address and a column address;

a row address circuit adapted to receive and decode the row address, and select a row of memory cells corresponding to the row address;

a column address circuit adapted to receive or apply data to one of the memory cells in the selected row corresponding to the column address;

a control circuit adapted to receive a command from an external source and generate control signals responsive thereto to cause write data to be stored in and read data to be output from the memory cells of the at least one array;

a read data path having a read register adapted to couple read data from the memory array to an externally accessible data terminal;

a write data path having a write register adapted to couple write data from the externally accessible data terminal to the memory array; and a differential amplifier included in the register of at least one of the data paths to couple data signals between the externally accessible data terminal to the memory array, the differential amplifier comprising:

a first amplifying circuit generating a first differential output signal from a first differential input signal;

a second amplifying circuit generating a second differential output signal from a second differential input signal; and an internal bias circuit structured to internally bias the first and second amplifying circuits, the first amplifying circuit, the second amplifying circuit, and the internal bias circuit being entirely symmetrical at all circuit nodes.

23. The memory device of claim 22 wherein:
the first and second amplifying circuits comprise respective pairs of PMOS and NMOS transistors coupled between a current source node and a current sink node, in which the source of the PMOS transistor in each pair is coupled to the current source node, the source of the NMOS transistor in each pair is coupled to the current sink node, the drains of the PMOS and NMOS transistors in each pair are coupled to each other to generate a respective one of the differential output signals, and the gates of the PMOS and NMOS transistors in each pair are coupled to each other and coupled to receive a respective one of the differential input signals; and
wherein the internal bias circuit comprises:
first and second electronically controlled current devices coupled between respective positive and negative supply voltages and the current source and current sink nodes, respectively, the electronically controlled current devices each having a control terminal adapted to receive a voltage to control the current flowing through the current device; and
respective pairs of PMOS and NMOS transistors coupled between the current source node and the current sink node, in which the source of the PMOS transistor in each pair is coupled to the current source node, the source of the NMOS transistor in each pair is coupled to the current sink node, the drains of the PMOS and NMOS transistors in each pair are coupled to the control terminals of the first and second electronically controlled current devices, and the gates of the PMOS and NMOS transistors in each pair are coupled to each other and coupled to receive a respective one of the differential input signals.

24. The memory device of claim 23 wherein the first electronically controlled current device comprises a PMOS transistor having its source coupled to the positive supply voltage, its drain coupled to the current source node, and its gate coupled to the drains of the transistors in the pairs of transistors of the internal bias circuit, and wherein the second electronically controlled current device comprises an NMOS transistor having its source coupled to the negative supply voltage, its drain coupled to the current sink node, and its gate coupled to the drains of the transistors in the pairs of transistors of the internal bias circuit.

25. The memory device of claim 23 wherein the second electronically controlled current device comprises first and second NMOS transistors each having its source coupled to the negative supply voltage, its drain coupled to the current sink node, and its gate coupled to the drains of the transistors in a respective pair of the transistors of the internal bias circuit.

26. The memory device of claim 23 wherein the first electronically controlled current device comprises first and second PMOS transistor each having its source coupled to the positive supply voltage, its drain coupled to the current source node, and its gate coupled to the drains of the transistors in a respective pair of the transistors of the internal bias circuit.

27. The memory device of claim 23 wherein:
the first electronically controlled current device comprises first and second PMOS transistor each having its source coupled to the positive supply voltage, its drain coupled to the current source node, and its gate coupled to the drains of the transistors in a respective pair of the transistors of the internal bias circuit; and
the second electronically controlled current device comprises first and second NMOS transistors each having its source coupled to the negative supply voltage, its drain coupled to the current sink node, and its gate coupled to the drains of the transistors in a respective pair of the transistors of the internal bias circuit.

28. The memory device of claim 23 wherein the negative supply voltage comprises ground potential.

29. A computer system, comprising:
a processor having a processor bus;
an input device coupled to the processor through the processor bus and adapted to allow data to be entered into the computer system;
an output device coupled to the processor through the processor bus adapted to allow data to be output from the computer system;
a memory controller coupled to the processor through the processor bus; and
a memory device coupled to the processor through the processor bus, comprising:
at least one array of memory cells adapted to store data at a location determined by a row address and a column address;
a row address circuit adapted to receive and decode the row address, and select a row of memory cells corresponding to the row address;
a column address circuit adapted to receive or apply data to one of the memory cells in the selected row corresponding to the column address;
a control circuit adapted to receive a command from an external source and generate control signals responsive thereto to cause write data to be stored in and read data to be output from the memory cells of the at least one array;
a read data path having a read register adapted to couple read data from the memory array to an externally accessible data terminal;
a write data path having a write register adapted to couple write data from the externally accessible data terminal to the memory array; and
a differential amplifier included in the register of at least one of the data paths to couple data signals between the externally accessible data terminal to the memory array, the differential amplifier comprising:
a first amplifying circuit generating a first differential output signal from a first differential input signal;
a second amplifying circuit generating a second differential output signal from a second differential input signal; and
an internal bias circuit structured to internally bias the first and second amplifying circuits, the first amplifying circuit, the second amplifying circuit, and the internal bias circuit being entirely symmetrical at all circuit nodes.

30. The computer system of claim 29 wherein:
the first and second amplifying circuits comprise respective pairs of PMOS and NMOS transistors coupled between a current source node and a current sink node, in which the source of the PMOS transistor in each pair is coupled to the current source node, the source of the NMOS transistor in each pair is coupled to the current sink node, the drains of the PMOS and NMOS transistors in each pair are coupled to each other to generate a respective one of the differential output signals, and the gates of the PMOS and NMOS transistors in each pair are coupled to each other and coupled to receive a respective one of the differential input signals; and
wherein the internal bias circuit comprises:

first and second electronically controlled current devices coupled between respective positive and negative supply voltages and the current source and current sink nodes, respectively, the electronically controlled current devices each having a control terminal adapted to receive a voltage to control the current flowing through the current device; and respective pairs of PMOS and NMOS transistors coupled between the current source node and the current sink node, in which the source of the PMOS transistor in each pair is coupled to the current source node, the source of the NMOS transistor in each pair is coupled to the current sink node, the drains of the PMOS and NMOS transistors in each pair are coupled to the control terminals of the first and second electronically controlled current devices, and the gates of the PMOS and NMOS transistors in each pair are coupled to each other and coupled to receive a respective one of the differential input signals.

31. The computer system of claim 30 wherein the first electronically controlled current device comprises a PMOS transistor having its source coupled to the positive supply voltage, its drain coupled to the current source node, and its gate coupled to the drains of the transistors in the pairs of transistors of the internal bias circuit, and wherein the second electronically controlled current device comprises an NMOS transistor having its source coupled to the negative supply voltage, its drain coupled to the current sink node, and its gate coupled to the drains of the transistors in the pairs of transistors of the internal bias circuit.

32. The computer system of claim 30 wherein the second electronically controlled current device comprises first and second NMOS transistors each having its source coupled to the negative supply voltage, its drain coupled to the current sink node, and its gate coupled to the drains of the transistors in a respective pair of the transistors of the internal bias circuit.

33. The computer system of claim 30 wherein the first electronically controlled current device comprises first and second PMOS transistor each having its source coupled to the positive supply voltage, its drain coupled to the current source node, and its gate coupled to the drains of the transistors in a respective pair of the transistors of the internal bias circuit.

34. The computer system of claim 30 wherein:

the first electronically controlled current device comprises first and second PMOS transistor each having its source coupled to the positive supply voltage, its drain coupled to the current source node, and its gate coupled to the drains of the transistors in a respective pair of the transistors of the internal bias circuit; and the second electronically controlled current device comprises first and second NMOS transistors each having its source coupled to the negative supply voltage, its drain coupled to the current sink node, and its gate coupled to the drains of the transistors in a respective pair of the transistors of the internal bias circuit.

35. The computer system of claim 30 wherein the negative supply voltage comprises ground potential.

* * * * *